(12) United States Patent
Willwohl et al.

(10) Patent No.: US 10,344,923 B2
(45) Date of Patent: *Jul. 9, 2019

(54) LED PACKAGE HAVING PROTRUSIONS FOR ALIGNMENT OF PACKAGE WITHIN A HOUSING

(71) Applicant: KONINKLIJKE PHILIPS N.V., Eindhoven (NL)

(72) Inventors: Harald Willwohl, Aachen (DE); Norbertus A. M. Sweegers, Lierop (NL); Jan Kloosterman, Esch (NL)

(73) Assignee: Koninklijke Philips N.V., Eindhoven (NL)

(*) Notice: Subject to any disclaimer, the term of this patent is extended or adjusted under 35 U.S.C. 154(b) by 158 days.

This patent is subject to a terminal disclaimer.

(21) Appl. No.: 15/418,538

(22) Filed: Jan. 27, 2017

(65) Prior Publication Data
US 2017/0138550 A1 May 18, 2017

Related U.S. Application Data

(63) Continuation of application No. 12/678,321, filed as application No. PCT/IB2008/053744 on Sep. 16, 2008, now Pat. No. 9,593,810.

(30) Foreign Application Priority Data

Sep. 20, 2007 (EP) .................................... 07116835

(51) Int. Cl.
*F21K 9/00* (2016.01)
*F21K 9/66* (2016.01)
(Continued)

(52) U.S. Cl.
CPC ............. *F21K 9/66* (2016.08); *F21K 9/00* (2013.01); *F21K 9/90* (2013.01); *F21S 41/141* (2018.01);
(Continued)

(58) Field of Classification Search
CPC ............... H01L 2223/544; H01L 2223/54426
See application file for complete search history.

(56) References Cited

U.S. PATENT DOCUMENTS 6,023,104 A 2/2000 Koizumi et al.
6,496,270 B1 12/2002 Kelley et al.
(Continued)

FOREIGN PATENT DOCUMENTS

EP 1326112 A2 7/2003
JP 06188458 A 7/1994
(Continued)

OTHER PUBLICATIONS

Notice of Reasons for Rejection dated Feb. 12, 2013, Japan Patent Application No. 2010-525472, 6 pages.
(Continued)

*Primary Examiner* — Gerald J Sufleta, II
(74) *Attorney, Agent, or Firm* — Brian D. Ogonowsky; Patent Law Group LLP

(57) ABSTRACT

A LED package (10) for use in a lamp as well as a method for manufacturing such kind of a LED package (10) are disclosed, wherein the LED package (10) comprises at least one LED (16), an optical element (18) for guiding light emitted by the LED (16), and a cover (26) for covering, at least partially, electrical components (20, 22, 24) connectable to the LED (16). The cover (26) includes three protrusions (38) that form the highest points on the package. The protrusions (38) abut a surface in a housing for accurately positioning the LED package relative to a lens (52) in the housing. The LED package (10) may be spring-loaded. Side protrusions (28) of the cover (26) additionally help to position the package within the housing.

16 Claims, 4 Drawing Sheets

(51) Int. Cl.
*F21S 41/143* (2018.01)
*F21S 41/141* (2018.01)
*F21S 43/14* (2018.01)
*F21V 29/70* (2015.01)
*F21S 41/19* (2018.01)
*F21S 43/19* (2018.01)
*F21K 9/90* (2016.01)
*G03B 21/20* (2006.01)
*H05K 1/02* (2006.01)
*H05K 3/30* (2006.01)
*F21Y 101/00* (2016.01)
*F21Y 115/10* (2016.01)

(52) U.S. Cl.
CPC ........... *F21S 41/143* (2018.01); *F21S 41/192* (2018.01); *F21S 43/14* (2018.01); *F21S 43/195* (2018.01); *F21V 29/70* (2015.01); *G03B 21/2033* (2013.01); *G03B 21/2093* (2013.01); *F21Y 2101/00* (2013.01); *F21Y 2115/10* (2016.08); *H05K 1/0269* (2013.01); *H05K 3/303* (2013.01)

(56) References Cited

U.S. PATENT DOCUMENTS

| | | | |
|---|---|---|---|
| 6,590,235 B2 | 7/2003 | Carey et al. | |
| 7,078,728 B2 | 7/2006 | Ishii et al. | |
| 7,208,772 B2 | 4/2007 | Lee et al. | |
| 7,244,965 B2 | 7/2007 | Andrews et al. | |
| 2003/0201462 A1* | 10/2003 | Pommer | G02B 6/4201 257/200 |
| 2003/0207479 A1* | 11/2003 | Border | G02B 6/3833 438/22 |
| 2004/0120632 A1 | 6/2004 | Simms | |
| 2006/0211168 A1 | 9/2006 | Ormond et al. | |
| 2006/0289975 A1* | 12/2006 | Aizpuru | H01L 23/49541 257/676 |
| 2007/0110361 A1 | 5/2007 | Harden et al. | |
| 2007/0178612 A1 | 8/2007 | Bradl | |
| 2007/0241357 A1 | 10/2007 | Yan | |
| 2008/0179614 A1 | 7/2008 | Wang et al. | |
| 2008/0197352 A1* | 8/2008 | Chen | H01L 22/12 257/48 |
| 2008/0254557 A1 | 10/2008 | Kim et al. | |
| 2008/0283861 A1 | 11/2008 | Loh et al. | |
| 2009/0002994 A1 | 1/2009 | Yoneda et al. | |
| 2009/0059594 A1* | 3/2009 | Lin | F21K 9/00 362/294 |
| 2009/0108281 A1 | 4/2009 | Keller et al. | |
| 2009/0136237 A1 | 5/2009 | Martini et al. | |
| 2009/0273102 A1* | 11/2009 | Nogami | H01L 23/544 257/797 |

FOREIGN PATENT DOCUMENTS

| | | |
|---|---|---|
| JP | 2004311861 A | 11/2004 |
| JP | 2007019133 A | 1/2007 |
| JP | 2007142371 A | 6/2007 |

OTHER PUBLICATIONS

EPO as ISA, PCTIB2008/053744, filed Sep. 16, 2008, "International Search Report and Written Opinion", dated Apr. 28, 2009, 16 pages.
First Office Action, China Application No. 200880107996.9, dated Mar. 10, 2011, 9 pages.
Grant Notification, China Application No. 200880107996.9, dated Sep. 23, 2011, 3 pages.
Office Action, European Application No. 08807671.6, dated Mar. 18, 2014, 4 pages.
Office Action, Taiwan Application No. 097135635, dated Jun. 13, 2014, 6 pages.

* cited by examiner

LED PACKAGE HAVING PROTRUSIONS FOR ALIGNMENT OF PACKAGE WITHIN A HOUSING

CROSS-REFERENCE TO RELATED APPLICATIONS

The present application is a continuation of U.S. patent application Ser. No. 12/678,321 filed on Jun. 21, 2010, titled "LED PACKAGE AND METHOD FOR MANUFACTURING THE LED PACKAGE", which is a § 371 application of International Application No. PCT/IB2008/053744 filed on Sep. 16, 2008, which claims priority to European Patent Application No. 07116835.5 filed on Sep. 20, 2007. U.S. patent application Ser. No. 12/678,321, International Application No. PCT/IB2008/053744, and European Patent Application No. 07116835.5 are incorporated herein.

FIELD OF THE INVENTION

The invention relates to the field of LED packages, which may be used in motor vehicle lamps to provide light by means of at least one light emitting diode (LED) of the LED package. The invention relates further to a method, by which such kind of a LED package may be manufactured.

BACKGROUND OF THE INVENTION

From U.S. Pat. No. 6,023,104, a LED package is known, which is received by arranging several LED arrays each comprising an alignment mark onto a common printed circuit board comprising a reference mark, wherein this arrangement is performed by adjusting the alignment marks with respect to the same reference mark by means of an optical comparison.

It is a disadvantage of such kind of a LED package that in more demanding arrangements, when additional parts, like optical elements or covers, are provided, the optical performance of the LED package may be affected. Particularly the brightness and the luminous flux of the LED package are affected.

SUMMARY OF THE INVENTION

It is an object of the invention to provide a LED package, which provides an improved optical performance, particularly an improved brightness and an improved luminous flux, as well as a method to manufacture such kind of a LED package.

This object is achieved by a LED package for use in a lamp comprising at least one LED, an optical element for guiding light emitted by the LED, a cover for covering at least partially electrical components connectable to the LED and at least one optical detectable reference mark, wherein the optical element comprises at least one first optical detectable mark and the cover comprises at least one second optical detectable mark, whereby the optical element and the cover are arranged and aligned both with respect to the same reference mark by means of the first mark and the second mark.

Due to the marks of the optical element and the cover it is not necessary to arrange and align the cover with respect to the optical element, which is arranged and aligned for instance with respect to the LED, but to arrange and align the optical element and the cover both with respect for instance to the LED. Due to the same reference for both the optical element and the cover manufacturing tolerances are not added to each other so that the accuracy of a correct arrangement is increased. Particularly manufacturing tolerances may compensate each other. Although several different parts of the LED package are provided, which normally may affect the brightness and/or the luminous flux of the light leaving the LED package due to manufacturing tolerances leading to scattered light, a significant rise of scattered light is prevented. Particularly it is possible to perform the positioning of the optical element and the cover by means of the same optical system. Thus, a higher manufacturing accuracy and an improved optical performance may be provided without the need for additional manufacturing apparatuses. An adapted control software for already existing manufacturing machines is sufficient to manufacture the LED package according to the invention. The quality of the LED package is improved at low costs. Further the optical element and the cover are two-piece so that different materials may be selected. For instance, the material of the optical element is chosen with respect to high heat resistance and good optical properties, wherein it is not necessary to chose the same material for the cover, since the cover may be arranged spaced to the LED and/or the optical element without affecting the optical performance of the LED package.

Particularly it is possible to increase the accuracy effect by providing additional parts of the LED package with marks for arranging and aligning this part with respect to the same reference mark. Preferably a substrate is provided, onto which the LED is arranged, wherein the substrate comprises the reference mark or the substrate comprises at least one third optical detectable mark for arranging and aligning the substrate with respect to the same reference mark. Since the LED may be fixed to the substrate it is sufficient, when the substrate comprises the reference mark in order to position the optical element and the cover accurately with respect to the LED. Particularly a heat sink for leading away heat from the LED may be provided, to which the LED is thermally connected, wherein the heat sink comprises the reference mark or the heat sink comprises at least one forth optical detectable mark for arranging and aligning the heat sink with respect to the same reference mark. Preferably the LED or a lighting field element comprising the LED comprises at least one fifth optical detectable mark for arranging and aligning the LED or the lighting field element with respect to the same reference mark. The lighting element may comprise several LEDs arranged in regular pattern, wherein the LEDs may be provided onto a common substructure comprising the reference mark.

In a preferred embodiment between the cover and the LED and/or the optical element a thermal barrier, particularly a gap, is provided. Due to the high thermal insulation, it is not necessary to choose the material of the cover with respect to a high heat resistance so that the cover may be manufactured for example of a thermoplastic material by injection molding. Particularly the cover comprises a lower heat resistance than the heat resistance of the optical element.

Preferably the cover comprises at least one, particularly three alignment element, particularly alignment protrusion, for aligning the cover with respect to a housing of a lamp. The alignment protrusion may abut the housing so that a correct alignment of the LED package with respect to the housing is performed by the alignment protrusions. Thus, an alignment perpendicular to the plane of the reference marks is provided. An alignment in three orthogonal directions may be realized.

The cover may comprise at least one, particularly tapered, connection opening for connecting the cover via the connection opening particularly by laser welding. By means of the connection openings it is possible to fix the cover to a structure like the substrate or the heat sink without moving the cover relative to the structure. Thus, a fixation is possible without affecting the alignment.

The invention further relates to a lamp, particularly headlight or taillight for motor vehicles, comprising a LED package, which may be designed as previously described, and a housing, to which the LED package is connected via the cover. Since the necessary alignment of the LED is performed during the manufacturing of the LED package the assembling of the LED package into the lamp may be facilitated. For instance, it is sufficient to provide a snap connection between the cover of the LED package and the housing of the lamp to provide an accurate alignment of the LED package.

Preferably the housing comprises at least one referencing features for mounting at least one secondary optics element such as lenses or collimators adjacent to the optical element. The secondary optics element may be part of a lens system, so that the light emitted from the LED package may be focused as desired. Since the LED package is connected to the housing, an exact positioning of the LED package with respect to housing is possible so that the secondary optics element(s) may be arranged very accurate with respect to the optical element of the LED package. Preferably the secondary optics element is arranged close to the optical element so that mainly all emitted light is collected by the secondary optics element.

The invention relates further to a method of manufacturing a LED package as previously described, wherein a reference mark is provided at the LED package, particularly at the substrate or the heat sink, the optical element is arranged and aligned with respect to the reference mark via the first optical detectable mark by means of an optical system and the cover is arranged and aligned with respect to the same reference mark via the second optical detectable mark by means of the optical system.

BRIEF DESCRIPTION OF THE DRAWINGS

These and other aspects of the invention will be apparent from and elucidated with reference to the embodiments described hereinafter.

In the drawings.

DETAILED DESCRIPTION OF EMBODIMENTS

Figure 1:
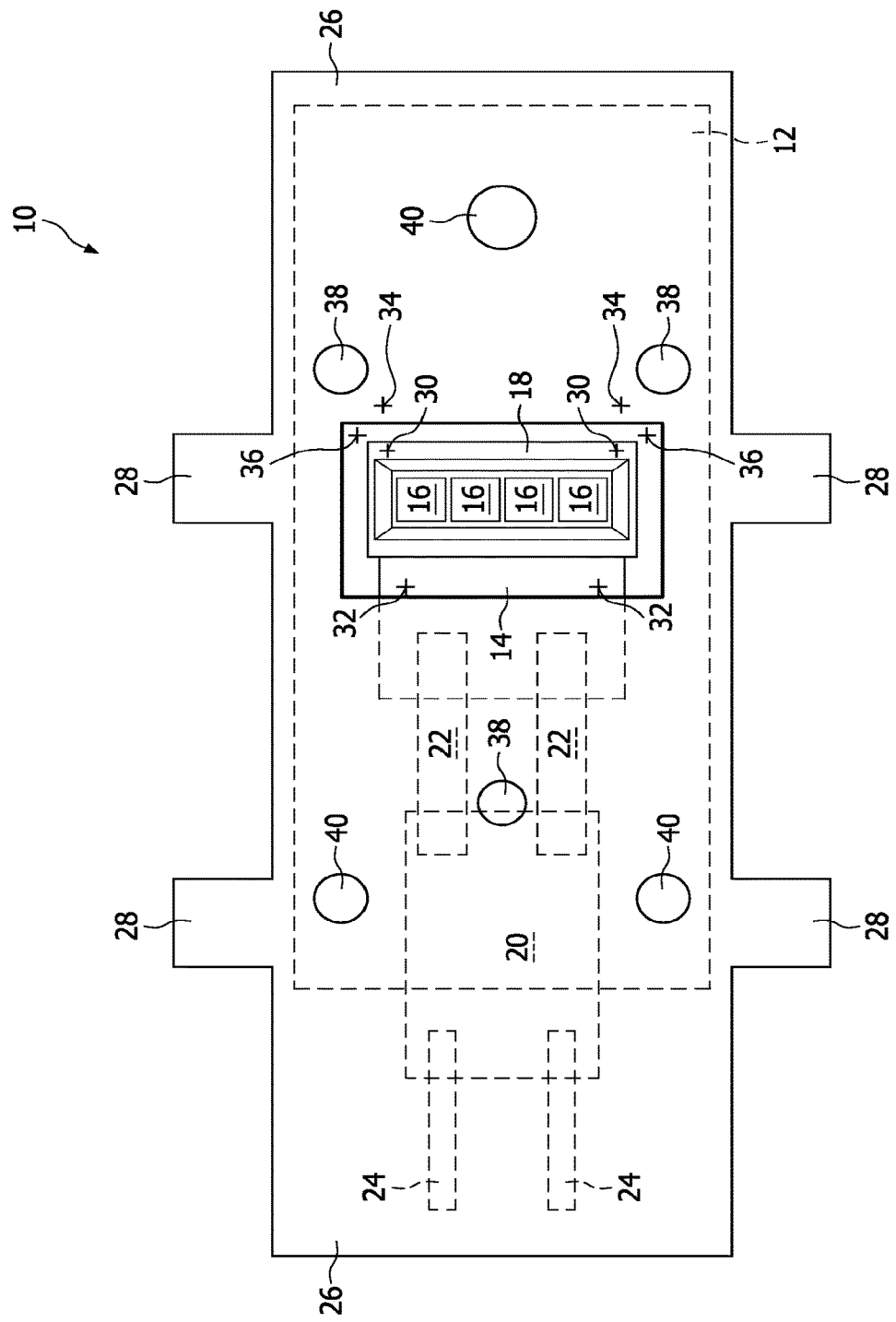
FIG. 1 is a schematic top view of the LED package according to the invention and FIG. 2 is a schematic sectional view of the LED package of FIG. 1.

The LED package 10 illustrated in FIG. 1 comprises a heat sink 12, which may be a copper plate or the like. A substrate 14 is thermally and mechanical connected to the heat sink 12. Four LEDs 16 arranged in a line are fixed to the substrate 14. The LEDs 16 are surrounded by an optical element 18, which may be a collimator comprising a reflective coating for collecting and guiding light emitted by the LEDs 16.

The optical element 18 is aligned in close vicinity to the LEDs 16. Preferably the optical element 18 comprises a material of high specular or diffuse reflectivity and a high temperature resistance. The coefficient of reflection may be ≥85%, preferably ≥90% and most preferred ≥95%. This material may comprise a good long term stability above 150° C. A high temperature plastics material such as LCP filled with $TiO_2$ or $Al_2O_3$ particles may be used as material with a high diffuse reflectivity.

Further a printed circuit board (PCB) 20 is provided to control the LEDs 16. The PCB 20 is connected to the LEDs 16 via connecting means 22, which are connected to not illustrated lines arranged on the substrate 14. Connectors 24 are connected to the PCB 20 for applying an electrical source. Preferably a direct electrical connection between the connectors 24 and the substrate 14 is established. Most preferred this electrical connection is performed by a laser welding joint of the connectors 24 to a conductive layer of the substrate 14.

A cover 26 covers the connectors 24, the PCB 20, the connecting means 20 and most of the substrate 14 as well as the heat sink 12. The cover comprises projections 28, by means of which the LED package 10 may by fastened to a housing of a lamp. Due to the projections 28 the LED package may be accurate positioned relative to the housing, a lens system or the like. For example, the protrusions 28 may be spring-loaded received by a recess of such kind of a housing, so that a definite and accurate alignment of the LED package is provided.

The optical element 18 comprises two first marks 30, which are optical detectable by an optical system for providing a correct arrangement and alignment with respect to two reference marks 32, which are provided at the substrate 14 in the illustrated embodiment. The cover 26 comprises two second optical detectable marks 34, by means of which the cover 26 is arranged and aligned with respect to the same reference marks 32 of the substrate 14. In an alternate embodiment, the marks 32 may be third optical detectable marks 32 for arranging and aligning the substrate 14 as well as the LEDs 16 fixed to the substrate 14 with respect to reference marks arranged somewhere else, for example on the heat sink 12, wherein the optical element 18 and the cover 26 are positioned to the same reference mark. The heat sink 12 may comprise two forth optical marks 36 so that the substrate 14 and the heat sink 12 may be correct positioned to each other via the same reference mark 32.

The cover 26 further comprises three alignment protrusions 38, which protrude to the same level (FIG. 2), so that the LED package 10 may be positioned at a correct height at a housing of a motor vehicle lamp or an external optical system such as a reflector or a projector system. For that purpose, the LED package 10 may be spring loaded, for instance via the heat sink 12, so that all three alignment protrusions 38 are in contact to the housing in assembled state. Further the cover 26 comprises three tapered connection openings 40 so that the cover 26 may be connected to the heat sink 12 via laser welding or the like. Between the cover 26 and the optical element 18 is a gap 42 provided. The gap 42 provides a thermal barrier, so that the heat emitted by the LEDs 16 and conducted to the optical element 18 is mainly not conducted to the cover 26.

Figure 2:
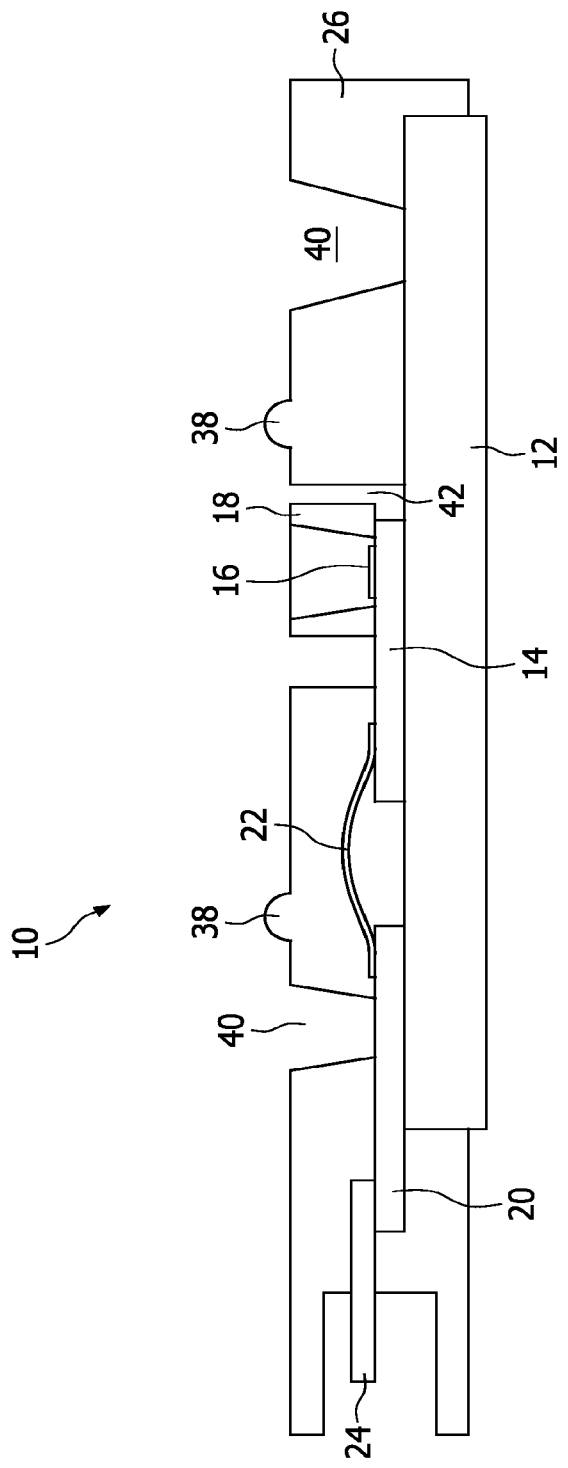
Figure 3:
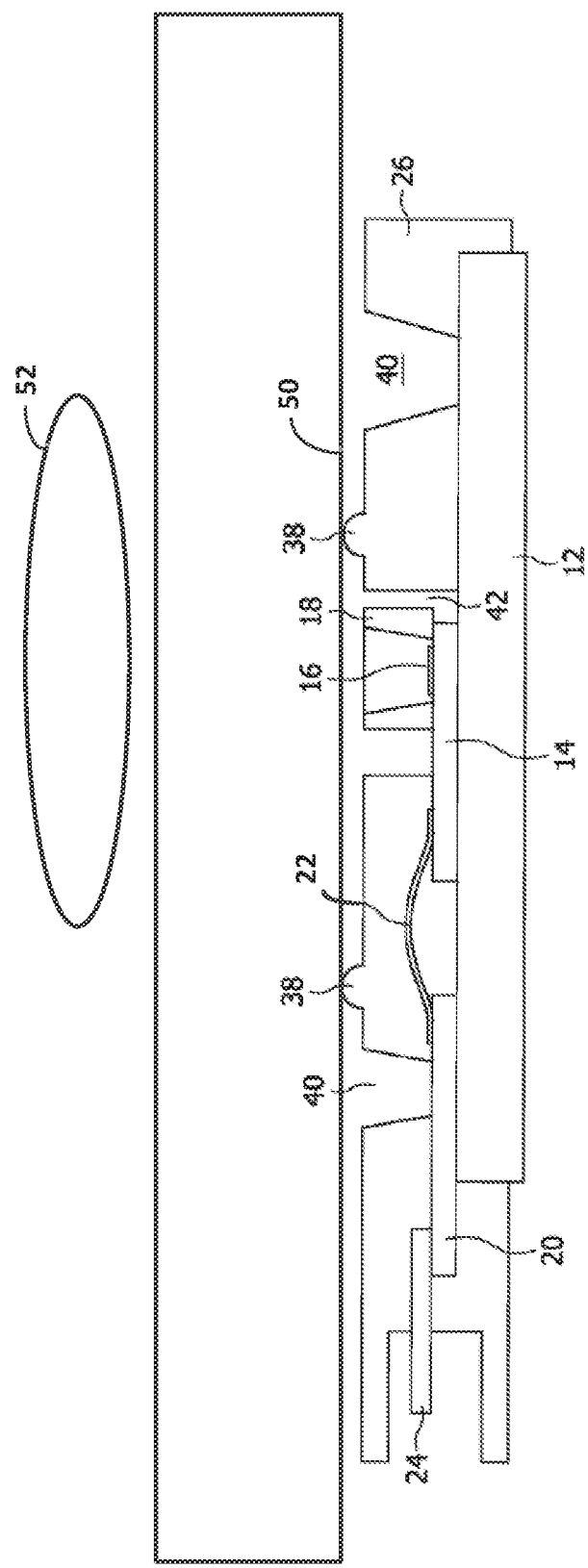
FIG. 3 is a sectional view of the package of FIG. 2 with protrusions on the cover contacting a surface of a housing to accurately position the LED relative to a lens or collimator.

FIG. 3 is a sectional view of the package of FIG. 2 with the protrusions 38 on the cover 26 contacting a surface 50 of a housing to accurately position the LED 16 relative to a lens 52 or collimator.

Figure 4:
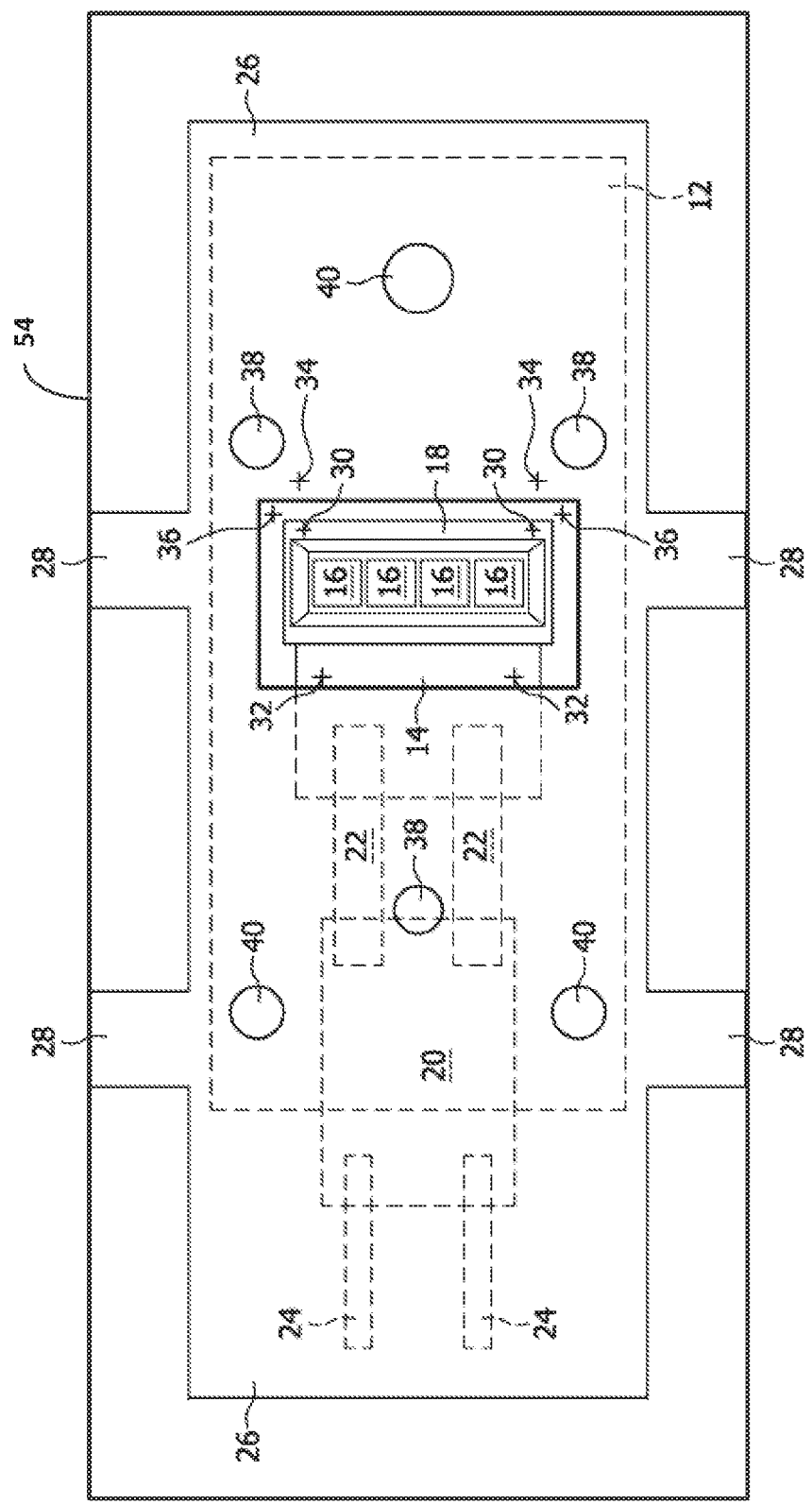
FIG. 4 is a top down view of the package of FIG. 1 with side projections contacting a surface of a recess in a housing to accurately position the LED relative to the housing.

FIG. 4 is a top down view of the package of FIG. 1 with side projections 28 contacting a surface 54 of a recess in a housing to accurately position the LED 16 relative to the housing.

While the invention has been illustrated and described in detail in the drawings and foregoing description, such illustration and description are to be considered illustrative or exemplary and not restrictive; the invention is not limited to the disclosed embodiments.

For example, it is possible to operate the invention in an embodiment wherein the fourth mark 36 of the heat sink 12 is the reference mark instead of the mark 32 of the substrate 14. Further the LEDs 16 may comprise fourth optical detectable marks or the LEDs may be connected to common substructure of a separate lighting field connected to the substrate 14, wherein the lighting field, particularly the substructure, like a thin film layer, may comprise the fourth marks for arranging and aligning the LEDs 16 with respect to the same reference mark 32. Further the marks 30, 32, 34, 36 may not only be designed cross-like. The marks 30, 32, 34, 36 may have any suitable design sufficient to compare two different marks 30, 32, 34, 36 by optical techniques for alignment to each other in two different directions.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage. Any reference signs in the claims should not be construed as limiting the scope.

What is claimed is:

1. A device comprising a light emitting diode (LED) package, the LED package comprising:
   at least one LED mounted over a base having electrical connectors; and
   a cover provided over the base,
   wherein the cover comprises at least three alignment first protrusions on its top surface, the at least three alignment first protrusions having a same height above the base and forming the highest points of the LED package, for concurrently contacting a surface during positioning of the LED package in a housing for positioning the LED package at a correct height in the housing relative to a first optical element.

2. The device of claim 1 further comprising second protrusions from a side of the cover, the second protrusions contacting the housing for positioning the package at a correct position within the housing.

3. The device of claim 2 wherein the second protrusions are received by a recess in the housing.

4. The device of claim 1 wherein the base comprises a substrate onto which the at least one LED is mounted.

5. The device of claim 1 wherein the base comprises a heat sink configured to conduct heat away from the at least one LED.

6. The device of claim 1 further comprising a second optical element affixed to the base overlying the at least one LED.

7. The device of claim 6 wherein the first optical element comprises a lens, wherein the housing includes the lens, and the first protrusions cause the LED package to be positioned with respect to the lens.

8. The device of claim 7 wherein the housing is part of a motor vehicle lamp.

9. The device of claim 7 wherein the housing is part of a projection system.

10. The device of claim 6 wherein the second optical element is a collimator.

11. A method of positioning an LED package in a housing comprising:
    providing at least three alignment first protrusions on a top surface of the package, forming the highest points of the LED package, the first protrusions having a same height above a base of the package; and
    positioning the LED package in a housing such that the three alignment first protrusions concurrently contact a surface in the housing for positioning the LED package at a correct height in the housing relative to a first optical element.

12. The method of claim 11 wherein the package also comprises second protrusions from a side of the package, the second protrusions contacting the housing for positioning the package at a correct position within the housing.

13. The method of claim 12 wherein the second protrusions are received by a recess in the housing.

14. The method of claim 11 wherein the first optical element comprises a lens, and wherein the first protrusions position the LED package relative to the lens in the housing.

15. The method of claim 11 wherein the housing is part of a motor vehicle lamp.

16. The method of claim 11 wherein the housing is part of a projection system.

* * * * *